US 8,809,780 B2

(12) United States Patent
Wollenhaupt et al.

(10) Patent No.: US 8,809,780 B2
(45) Date of Patent: *Aug. 19, 2014

(54) ELECTRON BEAM LAYER MANUFACTURING USING SCANNING ELECTRON MONITORED CLOSED LOOP CONTROL

(71) Applicant: Sciaky, Inc., Chicago, IL (US)

(72) Inventors: Phillip E. Wollenhaupt, Crown Point, IN (US); Scott Stecker, Willow Springs, IL (US)

(73) Assignee: Sciaky, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/078,910

(22) Filed: Nov. 13, 2013

(65) Prior Publication Data
US 2014/0061167 A1    Mar. 6, 2014

Related U.S. Application Data

(63) Continuation of application No. 12/902,520, filed on Oct. 12, 2012, now Pat. No. 8,598,523.

(60) Provisional application No. 61/261,090, filed on Nov. 13, 2009.

(51) Int. Cl.
| | | |
|---|---|---|
| *B23K 15/00* | (2006.01) | |
| *H01J 37/305* | (2006.01) | |
| *H01J 37/30* | (2006.01) | |
| *H01J 37/304* | (2006.01) | |

(52) U.S. Cl.
CPC ............ *B23K 15/0086* (2013.01); *H01J 37/305* (2013.01); *H01J 37/304* (2013.01); *H01J 37/3005* (2013.01)
USPC .................. 250/307; 219/121.23; 219/121.17

(58) Field of Classification Search
USPC .......................................................... 250/307
See application file for complete search history.

(56) References Cited

U.S. PATENT DOCUMENTS

| 3,718,758 A | 2/1973 | Ponghis et al. |
| 4,131,914 A | 12/1978 | Bricmont |
| (Continued) | | |

FOREIGN PATENT DOCUMENTS

| EP | 1765003 A1 | 3/2007 |
| EP | 2119530 A1 | 11/2009 |
| (Continued) | | |

OTHER PUBLICATIONS

Seufzer and Taminger, "Control of Space-based electron Beam Free Form Fabrication" (accessed at ntrs.nasa.gov/archive/nasa/casi.ntrs.nasa.gov/20070030308_2007030399.pdf) (Oct. 23, 2007.).

(Continued)

*Primary Examiner* — Jack Berman
(74) *Attorney, Agent, or Firm* — The Dobrusin Law Firm, P.C.

(57) ABSTRACT

A process (and apparatus for performing the process) for layer manufacturing a three-dimensional work piece comprising the steps of: feeding raw material in a solid state to a first predetermined location; exposing the raw material to an electron beam to liquefy the raw material; depositing the raw material onto a substrate as a molten pool deposit, the deposit having a forward edge region in an x-y plane with a forward edge region width and a trailing edge region in the x-y plane with a trailing edge region width, under at least one first processing condition; monitoring the molten pool deposit for at least one preselected condition using detecting of scatter from a scanning electron beam contemporaneously with the depositing step; solidifying the molten pool deposit; automatically altering the first processing condition to a different processing condition based upon information obtained from the comparing step; and repeating steps at one or more second locations for building up layer by layer, generally along a z-axis that is orthogonal to the x-y plane, a three-dimensional work piece.

20 Claims, 5 Drawing Sheets

(56) References Cited

U.S. PATENT DOCUMENTS

| | | | |
|---|---|---|---|
| 4,323,756 A | 4/1982 | Brown et al. |
| 4,429,401 A | 1/1984 | Avicola |
| 4,794,259 A | 12/1988 | Sanderson |
| 4,898,317 A | 2/1990 | Ito et al. |
| 4,920,776 A | 5/1990 | Denzler |
| 4,927,992 A | 5/1990 | Whitlow et al. |
| 4,998,004 A | 3/1991 | Lawrence et al. |
| 5,065,029 A | 11/1991 | Krivanek |
| 5,149,934 A | 9/1992 | Haynie et al. |
| 5,151,571 A | 9/1992 | Sanderson et al. |
| 5,162,906 A | 11/1992 | Yorita et al. |
| 5,534,314 A | 7/1996 | Wadley et al. |
| 5,557,110 A | 9/1996 | Itoh |
| 5,596,228 A | 1/1997 | Anderton et al. |
| 5,669,433 A | 9/1997 | Sterett et al. |
| 5,736,072 A | 4/1998 | Satoh |
| 5,805,620 A | 9/1998 | Liu et al. |
| 5,869,801 A | 2/1999 | Paton et al. |
| 5,871,805 A | 2/1999 | Lemelson |
| 5,947,179 A | 9/1999 | Kinane et al. |
| 5,960,853 A | 10/1999 | Sterett et al. |
| 6,046,426 A | 4/2000 | Jeantette et al. |
| 6,091,444 A | 7/2000 | McCarville et al. |
| 6,143,378 A | 11/2000 | Harwell |
| 6,193,923 B1 | 2/2001 | Leyden et al. |
| 6,229,563 B1 | 5/2001 | Miller, II et al. |
| 6,399,945 B1 | 6/2002 | Hirayanagi |
| 6,401,001 B1 | 6/2002 | Jang et al. |
| 6,405,095 B1 | 6/2002 | Jang et al. |
| 6,459,951 B1 | 10/2002 | Griffith et al. |
| 6,472,029 B1 | 10/2002 | Skszek |
| 6,580,959 B1 | 6/2003 | Mazumder |
| 6,680,456 B2 | 1/2004 | Adams |
| 6,710,280 B2 | 3/2004 | Mazumder et al. |
| 6,778,209 B1 | 8/2004 | Eversole et al. |
| 6,793,140 B2 | 9/2004 | Mazumder |
| 6,815,685 B2 | 11/2004 | Wany |
| 6,859,681 B1 | 2/2005 | Alexander |
| 6,937,921 B1 | 8/2005 | Mazumder |
| 6,995,334 B1 | 2/2006 | Kovacevic et al. |
| 7,020,539 B1 | 3/2006 | Kovacevic et al. |
| 7,073,561 B1 | 7/2006 | Henn |
| 7,107,118 B2 | 9/2006 | Orozco et al. |
| 7,168,935 B1 | 1/2007 | Taminger et al. |
| 7,262,385 B2 | 8/2007 | Fuson |
| 7,326,377 B2 | 2/2008 | Adams |
| 7,380,697 B2 | 6/2008 | Seki |
| 7,479,632 B1 | 1/2009 | Gevelber et al. |
| 7,648,740 B2 | 1/2010 | Slaughter |
| 7,765,022 B2 | 7/2010 | Mazumder et al. |
| 8,344,281 B2 | 1/2013 | Taminger et al. |
| 8,598,523 B2 * | 12/2013 | Stecker et al. ............... 250/307 |
| 2003/0075836 A1 | 4/2003 | Fong |
| 2005/0173380 A1 | 8/2005 | Carbone |
| 2005/0288813 A1 | 12/2005 | Yang et al. |
| 2006/0050147 A1 | 3/2006 | Gao et al. |
| 2006/0196853 A1 | 9/2006 | Elmer et al. |
| 2007/0017908 A1 | 1/2007 | Sercel et al. |
| 2008/0296278 A1 | 12/2008 | Meckler |
| 2008/0314878 A1 | 12/2008 | Cai et al. |
| 2009/0134005 A1 | 5/2009 | Sato et al. |
| 2010/0122901 A1 | 5/2010 | Weinstein et al. |
| 2010/0260410 A1 | 10/2010 | Taminger et al. |
| 2010/0270274 A1 | 10/2010 | Taminger et al. |
| 2010/0325902 A1 | 12/2010 | Dutta et al. |
| 2011/0008530 A1 | 1/2011 | Woods et al. |

FOREIGN PATENT DOCUMENTS

| | | |
|---|---|---|
| JP | 11/179578 A | 7/1999 |
| JP | 56/151185 A1 | 7/1999 |
| WO | 99/36738 A1 | 7/1999 |
| WO | 01/36146 A1 | 5/2001 |
| WO | 2004/020139 A1 | 3/2004 |
| WO | 2007/000069 A1 | 1/2007 |

OTHER PUBLICATIONS

Sharma, "On Electron Beam Additive Manufacturing Process for Titanium Alloys"( Abstract for Session on Apr. 27, 2009 Spring 2009 AIChE National Meeting).

Matz, John, "Carbide Formation in a Nickel-Based Superalloy During Electron Beam Solid Freeform Fabrication," Jul. 30, 1999, pp. 1-94.

Dave', V. R. et al., "Electron Beam Solid Freeform Fabrication of Metal Parts," 1999, p. 64-71.

Taminger, Karen, "Airbus Materials and Structures Workshop," Metals & Thermal Structures Branch NASA Langley Research Center, Electron beam Freeform Fabrication Technology Development for Aerospace Applications, Apr. 6-7, 2006.

Taminger, Karen et al., "Electron Beam Freeform Fabrication in the Space Environment," Jun. 25-28, 2007.

Taminger, Karen et al., "Solid Freeform Fabrication: An Enabling Technology for Future Space Missions," Apr. 8-10, 2002.

Caryn Meissner, "Standardizing the Art of Electron-Beam Welding," S&TR, Mar./Apr. 2008, p. 11-13.

Beersiek Joerg, "New Aspects of Monitoring with a CMOS camera for Laser Materials Processing," published at ICALEO 2002, Section F206.

Plasma Monitor PM 7000.; Prometec GmbH, 2003.

J. Beersiek, T. Devermann, K. Behler; "Practical Applications of In-Process Monitoring for Laser Processes Not Only for Single Welds and Common Materials," 2004.

J. Beersiek; "A CMOS Camera as a Tool for Process Analysis Not Only for Laser Beam Welding," published at ICALEO 2001.

Process Monitoring System Welding Monitor PD 2000, 2006.

Process Control Laser Welding, Welding Monitor PD 2000, available at http://www.prometec.com/english/pages/contents/laser_pd2000_con.htm, last accessed Dec. 18, 2008.

R. Thompson, SCIAKY W2000, A Multiple Weld Process CNC Machine Controller, 1997.

W-2000 Computer Control System, p. 1-14, Mar. 2000.

Y. Fukui, "Modulation Transfer Function (MTF)," p. 1-2, Mar. 20, 2003.

S. Stecker, K.W. Lachenberg, H. Wang, and R.C. Salo, Electron Beam Free Form Fabrication Technology, International Institute of Welding, p. 1-13, Oct. 4, 2006.

Stecker, S., K.W. Lachenberg, H. Wang, and R.C. Salo, "Advanced Electron Beam Free Form Fabrication Methods & Technology," p. 35-46 Oct. 2006.

Photon Focus, High-Dynamic CMOS Cameras; available at http://www.photonfocus.com/html/eng/products/products.php?prodId=24 last accessed Sep. 2010.

K. Taminger; "Electron Beam Freeform Fabrication," 2005.

Davé, V. R.: "Electron Beam Assisted Materials Fabrication," Diss. Massachusetts Institute of Technology (MIT) (1995).

K. Taminger and R. Hafley; "Characterization of 2219 Aluminum Produced by Electron Beam Freeform Fabrication." Aug. 5-7, 2002.

K. Taminger and R. Haley; "Electron Beam Freeform Fabrication for Cost Effective Near-Net Shape Manufacturing," Mar. 2006.

V.R. Dave, J.E. Matz, T.W. Eagar; "Electron Beam Solid Freefrom Fabrication of Metal Parts," p. 64-71, 1995.

Taminger, K. and R. Hafley; "Electron Beam Freeform Fabrication: A Rapid Metal Deposition Process"; Proceeding of the 3rd Annual Automotive Composites Conference SPE (2003).

Electron Beams: Useful for More than Just Microscopeas, Euroepean Tool and Mould making, Mar./Apr. 2002, http://www.tool-moldmaking.com/magazine/magdetail.php?company=2355&x=11&y=15, accessed Jul. 3, 2003.

J.E.Matz and T.W. Eagar; "Carbide Formation in Alloy 718 during Electron-Beam Solid Freeform Fabrication," vol. 33A, Aug. 2002.

Hamilton Standard W2, Electron Beam Welder; http://www.wme-inc.com/WebPages/EBWpgs/HSDW-2EBW.htm; accessed Sep. 29, 2009.

(56) References Cited

OTHER PUBLICATIONS

Fuentek, NASA's EBF3: The Future of Art-to-Part Manufacturing, available at: http:www.fuentek.com/technologies/EBF3.htm, last accessed Sep. 11, 2009, pp. 1-7.

Martin, R. et al, "Reducing Costs in Aircraft: The Metals Affordability Initiative," available at: http://www.tms.org/pubs/journals/JOM/0003/Martin-0003.html, accessed on Jan. 22, 2006, JOM 52(3) (2000) pp. 24-28.

Abbott et al., "Effects of Deposition and Thermal Processing Variables on Laser Additive Manufactured Ti—6A1—4V", 2003, Metals Affordability Initiative, AeroMat Jun. 11, 2003, pp. 1-25.

SAI Titanium Specialists, article available at: http://www.supraalloys.com/Machining_titanium.htm, last accessed Jan. 22, 2006.

Cooper, K., "Extending Rapid Prototyping Past the Horizon: Applications in Outer Space," Published Jan. 10, 2001. Abstract.

Lachenberg, K. "Electron Beam Free Form Fabrication (EBFFF) Processing Methods & Technology," Aeromat 2007 Jun. 25-28, 2007.

Potentially Related U.S. Appl. No. 12/902,520, filed Oct. 12, 2010.

Potentially Related U.S. Appl. No. 14/078,910, filed Nov. 13, 2013.

Potentially Related U.S. Appl. No. 13/029,306, filed Feb. 17, 2011.

Potentially Related U.S. Appl. No. 13/891,303, filed May 10, 2013.

International Search Report and Written Opinion, Application No. PCT/US2010/049044, dated Sep. 16, 2010.

International Search Report and Written Opinion, Application No. PCT/US2010/052261, dated Oct. 12, 2010.

Stecker, S. Characterization and application of weld pool oscillation phoenomenon for penetration control of gas tungsten arc welding, A Thesis—The Ohio State University (1996).

Nazarenko, O. "Welding Electron Beam Analyzer", available at http://www.nas.gov.ua/pwj/beam/il3c.html, Copyright 1999-2008 last accessed Mar. 2, 2009.

Nazarenko, O. "Founded in 1976, Electron Beam Welding Department of PWI Brings Advanced Technology and Equipment From The Laboratory To Industry For Materials Processing Applications.", available at http://www.nas.gov.ua/pwj/beam/index.html, Copyright 1999-2009 last accessed May 11, 2009.

Nazarenko, O. "Range of the KL-109, KL-110, and KL-111 Universal Machines for Electron Beam Welding of Large and Thick-Walled Products" available at http://www.nas.gov.ua/pwj/beam/mach.html, Copyright 1999-2010 last accessed May 5, 2011.

Taminger, K. "Electron Beam Freeform Fabrication: A metal deposition apparatus to build components directly from CAD" WBT Showcase, Mar. 26-27, 2008. www.nasa.gov.

Brice, C.A., et al., "Rapid Prototyping and Freeform Fabrication via Electron Beam Welding Deposition," Proceeding of Welding Conference, (2002).

Hofmeister, W. "Thermal imaging and control of electron beam freeform fabrication (ebf3)" NASA Space Institute.

Related Patent Application Office Action, U.S. Appl. No. 12/902,520, dated Oct. 4, 2012.

U.S. Appl. No. 61/167,540, filed Apr. 8, 2009.

\* cited by examiner

Leading Edge Region | Trailing Edge Region

ELECTRON BEAM LAYER MANUFACTURING USING SCANNING ELECTRON MONITORED CLOSED LOOP CONTROL

CLAIM OF BENEFIT OF FILING DATE

The present application claims the benefit of the filing date of U.S. Provisional Application No. 61/261,090, filed Nov. 13, 2009, the contents of which are hereby expressly incorporated by reference.

STATEMENT OF GOVERNMENT RIGHTS

The present subject matter was supported, at least in part, by SBIR Contract No. FA8650-09-M-5209. The United States government may have certain rights in the invention.

FIELD OF THE INVENTION

The present invention relates generally to layer manufacturing of articles and, more specifically, to additive manufacturing, direct manufacturing or solid freeform fabrication of articles using electron beam energy and closed loop control technology that relies upon electron phenomena detection for deposition condition monitoring.

BACKGROUND OF THE INVENTION

Free form fabrication (FFF), direct manufacturing (DM) and additive manufacturing (AM) are names for a general class of layer manufacturing (LM), in which a three-dimensional (3-D) article is made by the sequential build-up of layers of material. One or more suitable LM techniques may be utilized for making articles, (e.g., such as by creating one or more device patterns directly on a substrate). The LM technique usually includes a step of selectively depositing material layer by layer, selectively removing material layer by layer, or a combination thereof. Many LM techniques are attractive in that they avoid the need for masks, for pre-existing three-dimensional patterns, and/or expensive tooling.

Historically, LM processes that use electron beams for melting a metal have been generally performed in an open loop fashion, which relies throughout substantially the entirety of the process upon human intervention, and particularly an operator, to adjust operating parameters. For example, an operator typically is obliged to visually observe the LM process throughout the layer by layer buildup, generally external of an LM apparatus and through a viewing port of the LM apparatus. If and when an operator detects a perceived departure from the buildup process, as forecasted, the operator needs to immediately change operating parameters. This approach may pose potential for complications due to the subjectivity of the observations of the operator, due to any delay experienced between an observation and any adjustment in operating parameters, and/or due to improper selection of parameters.

In recent years, there has been a growing need for a reliable system that reduces reliance upon human operators of LM processes and equipment. Among the difficulties encountered in attempting to implement closed loop controls for LM techniques, and especially in the area of LM that employs layer by layer build up of articles using molten metal, has been the ability to suitably monitor deposits of metal. This is a particularly acute difficulty when attempting to conduct LM at relatively high output rates. Accordingly, there continues to be a need in the art for an improved system for monitoring layer manufacturing to provide feedback controls for forming a three-dimensional article.

U.S. Application No. 61/243,242 now U.S. application Ser. No. 12/883,340 (incorporated by reference) discloses various unique approaches to layer manufacturing. In general, the approaches address deposition condition monitoring by use of optical approaches, such as by monitoring with digital camera equipment. Notwithstanding the early success of such a system, there remains a need for other robust approaches to deposition condition monitoring.

Examples of efforts to provide layer manufacturing of articles and processes include those disclosed in U.S. Pat. Nos. 5,534,314; 5,669,433; 5,736,073; 5,871,805; 5,960,853; 6,401,001; 6,193,923; 6,405,095; 6,459,951; 6,680,456; 7,073,561; 7,168,935; and 7,326,377; and US Patent Application Nos. 20030075836; 20050173380; and 20050288813, all of which are incorporated by reference for all purposes. The possibility of closed loop controls for additive manufacturing of articles by electron beam fabrication processes is identified at col. 12, lines 8-15 in U.S. Pat. No. 7,168,935 (incorporated by reference). In Seufzer and Taminger, "Control of Space-based electron Beam Free Form Fabrication" (accessed at ntrs.nasa.gov/archive/nasa/casi.ntrs.nasa.gov/20070030308_2007030399.pdf) (incorporated by reference), the authors address a possible approach to a closed-loop control system. See also, Sharma, "On Electron Beam Additive Manufacturing Process for Titanium Alloys" (Abstract for Session on Apr. 27, 2009 Spring 2009 AIChE National Meeting) (incorporated by reference).

U.S. Pat. No. 6,091,444 (incorporated by reference) elaborates on some of the difficulties faced in imaging high temperature melts. The patent illustrates an example of a high temperature melt view camera that includes a water cooled enclosure with a pinhole in it, through which a gas is passed.

An example of an electron image detector configuration is illustrated in U.S. Pat. No. 4,794,259 (incorporated by reference).

There also remains a need for system that provides automatic alteration of processing conditions based on information obtained from monitoring the layer manufacturing of the three-dimensional article, pursuant to which the same beam generating device that is used for depositing metal is also used for detecting conditions of the deposited metal. Such system has the potential to allow for reduction in the overall size of the system and/or the number of components.

SUMMARY OF THE INVENTION

The present invention seeks to improve upon prior LM apparatus and processes by providing a unique process and apparatus for fabrication of articles utilizing the same component, namely an electron beam generator, to perform the functions of melting metal for deposit and scanning for substantially contemporaneously monitoring the condition of a resulting melt deposit as part of a closed loop control system. The invention makes advantageous use of one or more unique features for allowing rapid article builds, especially aided by use of detection of one or more electron phenomena that occurs from emission from the electron beam generator and interaction with a melt pool deposit.

As the following discussion will illustrate, the present teachings relate to a process (and associated apparatus for performing the process) for layer manufacturing a three-dimensional work piece comprising the steps of: feeding raw material in a solid state to a first predetermined location; exposing the raw material to an electron beam to liquefy the raw material; depositing the raw material onto a substrate as a molten pool deposit, the deposit having a forward edge region in an x-y plane with a forward edge region width and a trailing edge region in the x-y plane with a trailing edge region width, under at least one first processing condition; monitoring the molten pool deposit for at least one preselected condition using detecting of an electron phenomena (e.g., scatter) from a scanning electron beam substantially contemporaneously with the depositing step (which may include a step of comparing information about the preselected condition of the monitored molten pool deposit with a predetermined desired value (e.g., a value for the preselected condition of the monitored molten pool deposit)); solidifying the molten pool deposit; automatically altering the first processing condition to a different processing condition based upon information obtained from the comparing step; and repeating steps at one or more second locations for building up layer by layer, generally along a z-axis that is orthogonal to the x-y plane, a three-dimensional work piece.

One unique aspect of the present teachings is that the scanning electron beam that provides for a detectable electron phenomena may be a beam emitted from an electron beam generating device (e.g., one that is translatable over multiple axes relative to a work piece, which work piece may be in a fixed position) that also emits the electron beam to liquefy the raw material. Thus, during consecutive steps of exposing and monitoring, the same beam may be employed for both operations, and/or during which, the beam may be rastered according to a predetermined pattern (e.g., a generally spiral pattern). The monitoring step generally will include a step of detecting electrons scattered by a region proximate the molten pool deposit during build-up of the work piece. One approach to monitoring may employ measuring width of the molten pool (e.g., measuring the trailing edge region width of the molten pool deposit). It is thus possible that (i) upon detection of a width that exceeds a certain predetermined value, the power of the beam is reduced, (ii) upon detection of a width that is below a certain predetermined value the power of the beam is increased, or both (i) and (ii).

It is possible that the scanning electron beam may be consecutively switched back and forth between a first condition for melting and a second condition for monitoring at a rate of at least 5 times per second. More likely, however, the scanning electron beam is maintained at one or more generally constant power levels, and particularly a power level greater than about 500 watts, 1 kilowatt (kW), 2 kW or higher during the monitoring step. The scanning electron beam may be maintained at a substantially constant width for a period (e.g., at least about 5 seconds, 10 seconds, 30 seconds, 1 minute, 5 minutes, 0.25 hour, 0.5 hour, 1 hour or longer) during consecutive steps of exposing and monitoring. The monitoring may involve detecting electrons scattered in the region proximate the molten pool deposit during build-up of the work piece, by use of at least one detector (e.g., one that includes an antenna plate or a solid state detector) for measuring data (e.g., consecutively) from at least about 4000 beam deflection location points (e.g., greater than about 5000, 8000, 10,000, 13,000, 16,000, 25,000, 50,000 or even 100,000 points or higher) on a target. The monitoring may involve detecting electrons scattered in the region proximate the molten pool deposit during build-up of the work piece, by use of at least one shielded detector device. Any detection device for detecting electron scatter may be configured and operated so that it filters electrons having a predetermined energy level prior to detection by a detector, thereby preventing oversaturation of the device by scattered electrons. For example, it may employ a detector that is at least partially surrounded by a cage or other structure (e.g., a structure having the functional and/or structural components as taught herein) which may be electrically biased to selectively allow passage through the structure (to the detector) of electrons of a predetermined energy level.

Monitoring may also involve use of a device (e.g., a device for monitoring a laser beam, a device for optical image monitoring) for monitoring the distance of an electron beam generating device to the work piece during build-up of the work piece, and altering a processing condition based upon detection of a distortion in the z-axis. This may include a step of triangulating the distance. For example, the step of monitoring the distance of an electron beam generating device to the work piece may include detection by optical image monitoring with a digital camera that includes a vapor protection device, a thermally regulated housing or both, such as that described in U.S. Patent Application No. 61/243,242, now U.S. patent application Ser. No. 12/883,340.

By way of illustration, the step of automatically altering may be performed by at least one control device that is in electrical signaling communication with the electron beam generation device (e.g., an electron beam gun). During the monitoring, a detection signal may be transmitted to the at least one control device upon detection of an electron phenomena (e.g., scatter) and which is indicative of a characteristic of the phenomena. The detection signal information from the signal may be compared with a predetermined value, and based upon such comparison the control device may issue a control signal to the electron beam generating device. For example, it may cause a reduction or increase in power, current or voltage supplied to the electron beam generation device.

DETAILED DESCRIPTION OF THE INVENTION

The present invention provides an apparatus and process for layer manufacturing (LM) of a three-dimensional article. The invention is particularly directed at an apparatus and process for LM that provides high output rates. For example, it is possible that article (e.g., metallic article) build rates of at least about 0.5, 1.0, 1.5, 2.5, 3.5, or even 4.0 cm$^3$/hr, or higher, may be employed. It is also possible that, article (e.g., metallic article) build rates of at least about 2.5, 3.0, 3.3, 5, or even 6.8 kg/hour (e.g. having an average bead width of about 10 to about 15 mm) may be employed.

In general, the apparatus may include combinations of at least two or more of a material delivery device, an energy emission device (namely an electron beam generation device) that applies energy to liquefy a material (e.g., a metal) delivered by the material delivery device, a work piece support onto which liquefied material is deposited, a closed loop control device (e.g., one that is in signaling communication with at least one or more of the material delivery device, energy emission device or work piece support), a detector (e.g., one including an electron phenomena detecting mechanism) that operates for detecting a condition of material that has been deposited and supplies information about the condition to the control device so that the control device can change an operating parameter in response to the detected condition, and a housing that at least partially encloses some or all of the above components.

In general, the process may include supplying a material (e.g., a wire feed material), liquefying the material (e.g., by applying energy, such as from an electron beam), depositing liquefied material onto a work piece support as a molten pool deposit, monitoring the molten pool deposit by use of detection of one or more electron phenomena that occurs from emission from the electron beam generator and interaction with the molten pool deposit, and controlling operation of the process using a closed loop control system for changing an operating parameter in response to a detected condition of the molten pool deposit. The process may be performed to fabricate an article at a rate of at least about 0.5, 1.0, 1.5, 2.5, 3.5, or even 4.0 cm$^3$/hr, or higher. The process may also be performed to fabricate an article at a rate of at least about 2.5, 3.0, 3.3, 5 or even 6.8 kg/hour.

The apparatus and the process may make use of a detector that captures and processes data about a melt condition substantially in real time, and particularly a scanning electron imaging system that may be operated at a rate that is equivalent to the capturing of an image (such by completing an entire cycle of a scan of points (e.g., 4000 or more points as described herein) on the target) at a rate of at least about 10, 15, 20, 25, 30, 40, 50, or even 60 or more images per second.

The teachings herein contemplate generally the use of a system for performing LM such as that described generally in U.S. Application No. 61/243,242 now U.S. application Ser. No. 12/883,340 (incorporated by reference), but modified to incorporate the electron beam detection features specifically addressed herein, and optionally exclude the optical imaging components disclosed U.S. Application No. 61/243,242 now U.S. application Ser. No. 12/883,340 (incorporated by reference). In general, such systems includes a material delivery device for delivering raw material in a solid state (which may include at least one metal, which may be in the form of a wire), an electron beam generator (e.g, gun) that controllably emits an electron beam, a work piece support (e.g., a support that is motor-translated), a detector for detecting scattered electrons, an electronic control system with a suitable control device (preferably including at least one microprocessor) and a chamber. At least a portion of one or more of the components (e.g., the control system, a computer, or both) may reside outside of the chamber. The control system may be in controlling communication with one or more of the material delivery device, energy emission device, work piece support, or detector. The electron beam generator emits a beam for melting the raw material to form a molten pool deposit on a work piece support (e.g., onto a previous layer deposited onto a work piece support). The work piece support, the electron beam generator, and/or the material delivery device may be positionally translatable relative to each other, so that a work piece can be formed layer by layer from a plurality of successively deposited (and solidified) molten pool deposits. For example, the electron beam generation device may be translatable in a plurality of axes (e.g., 3, 4, 5 or 6 axes) relative to the work piece support (the latter of which may itself be fixed or translatable).

The system herein contemplates electron beam layer manufacturing that may involve manipulating a 3D cad model such that it can be used to generate computer numerically controlled (CNC) tool paths. The tool paths may be programmed such that the part model is "sliced" into layers that when executed on the apparatus of the present teachings, it will result in a near net shape, the result of depositing layer upon layer of material in the correct spatial location in an x-y-z Cartesian coordinate space. An electron beam generating device (e.g., an EB gun) may be used to supply the energy required to melt and fuse the deposited material, as well as to scan the deposited material for information about the deposit that can be used for a closed loop control operation. For example the teachings herein contemplate using information about the detected electrons to issue a signal that controls the operation of the electron beam generating device such as its power, current, voltage, beam characteristic or any combination thereof.

One preferred approach may also involve the use of an electron beam generating device that also provides for focusing and deflecting the electron beam by using programmable electromagnetic coils. A substrate plate can be used to provides a surface upon which to deposit material and which may become an integral part of the finished structure.

Figure 1A:
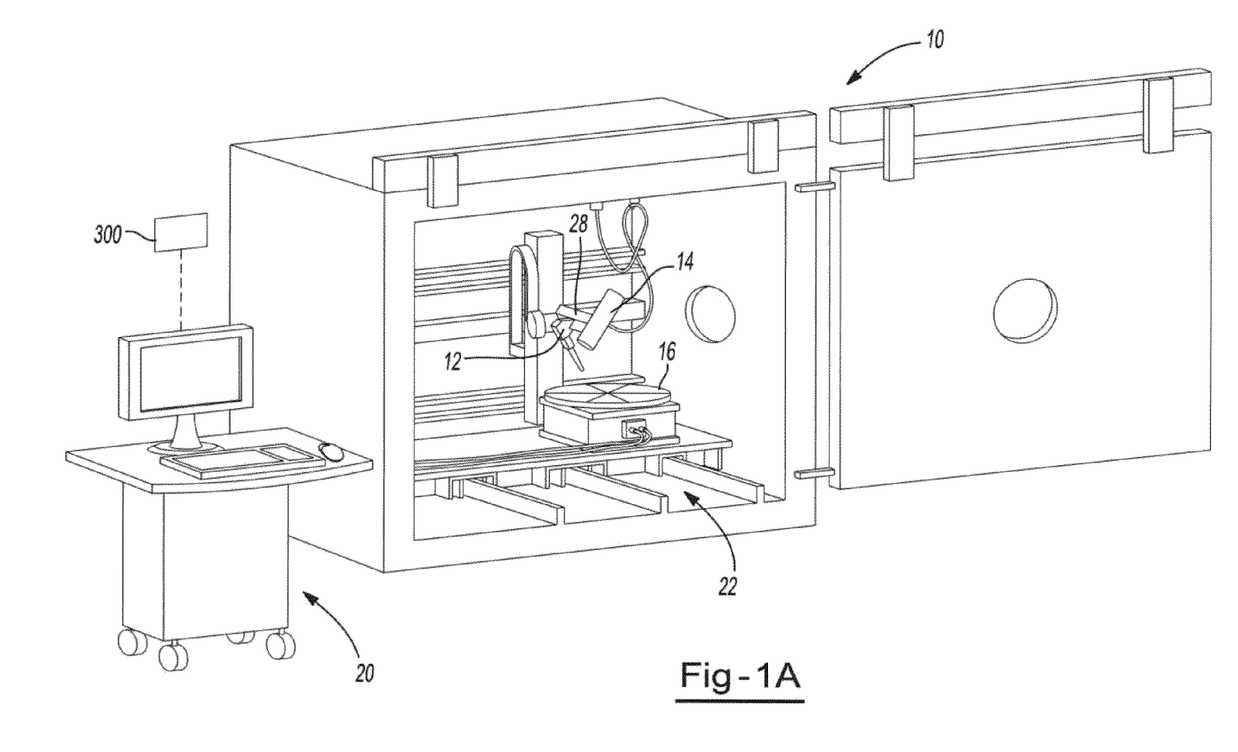
FIGS. 1A-C is a schematic of components of a system in accordance with the present teachings.
Figure 1B:
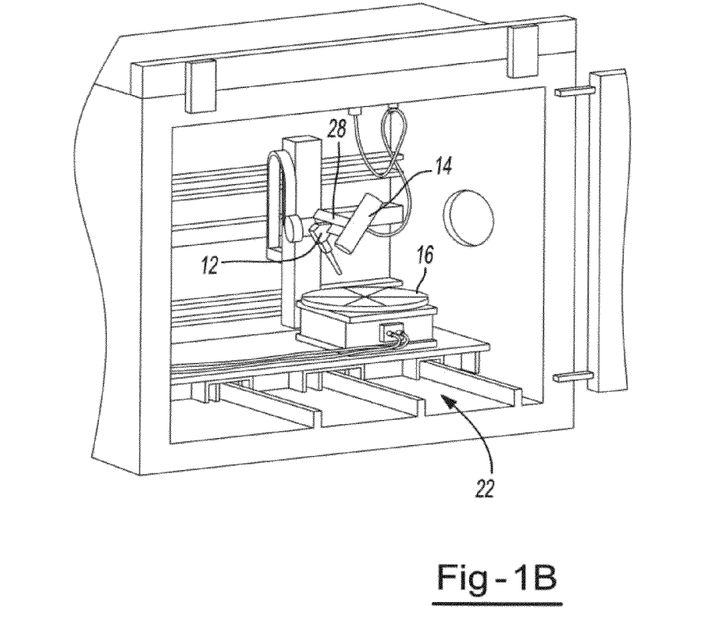
Figure 1C:
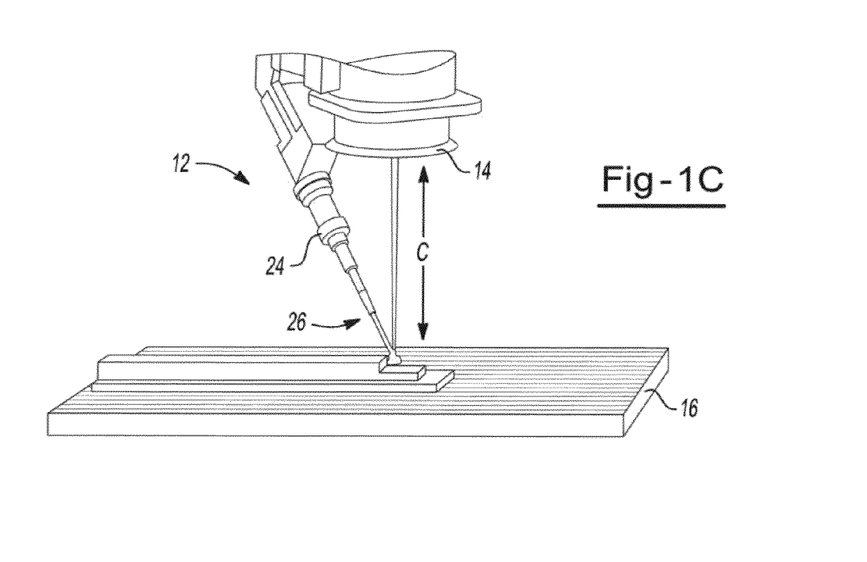

By reference to FIG. 1A there is illustrated schematically one such system for use herein. The LM apparatus 10 includes a material delivery device 12 (FIG. 1B) for delivering raw material in a solid state (e.g., one or more metals in a wire form, a powder form or both). An electron beam generator (e.g, gun) 14 controllably emits an electron beam. A work piece support 16 (e.g., a support that is motor-translated) is positioned so that the electron beam generator and the support may be translated relative to each other. One or more detectors 18 (e.g., a suitable antenna plate as described herein) is present for detecting one or more electron phenomena that occurs from emission from the electron beam generator and interaction with a melt pool deposit. For example, the one or more detector (which optionally may include a scintillator, a semiconductor or some other type of solid state device) may function to detect the presence or absence of beam scatter, absorption or both.

Figure 2:
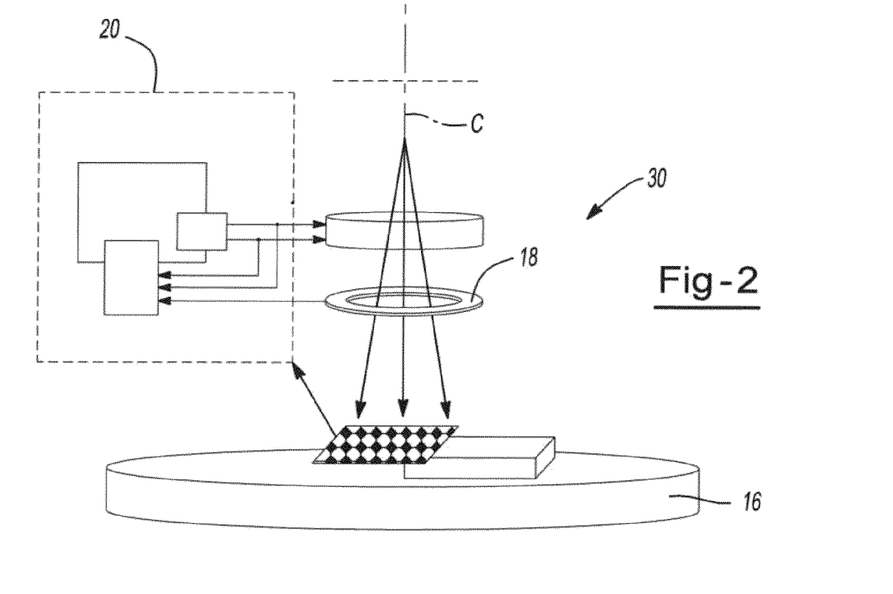
FIG. 2 is a perspective view illustrating one example of a system for electron beam manipulation and detection of an electron phenomena.

With reference to FIG. 2, one possible approach may be to employ a monitoring system 30 that includes an antenna plate as the detector 18, which may be configured and positioned to detect electrons scattered at a relatively low angle relative to the axis of the emitted beam (e.g., less than about 30°, 20°, 10° (e.g., about 5 to about 7°)). For example, the electron beam may be directed generally along and/or rastered about an axis (C) (which optionally may be generally perpendicular (e.g., about 90°) relative to the work piece support 16).

An electronic control system 20 with a suitable control device (preferably including at least one microprocessor) signally communicates (directly or indirectly) with one or any combination of the material delivery device 12, electron beam generator 14, work piece support 16, detector 18, or some other system component. A suitable enclosure for defining a chamber 20 may be employed to enclose at least the material delivery device 12, electron beam generator 14, work piece support 16, and detector 18. The chamber may be evacuated as desired for processing. The pressure may be evacuated with a suitable vacuum pump so that the pressure within the chamber ranges from about $1\times10^{-1}$ to about $1\times10^{-7}$ torr (or possibly lower). The pressure within the chamber may be less than about 0.1 torr, preferably less than about $1\times10^{-2}$ torr, and more preferably less than about $1\times10^{-4}$ torr.

Examples of suitable components and apparatus that may be employed in the present teachings include, without limitation, an electron beam welding and deposition system may be employed, such as one having components as found in the Sciaky model NG1 VX68. The apparatus thus may be a fully functioning electron beam welding and deposition system utilizing a low voltage moving gun technology. It may include six programmable CNC motion axes including XYZ linear and part rotation (R), part tilt (T), and electron beam gun tilt axes.

Wire may be used as the feed material, and its feed rate can be precisely calculated and controlled. The wire may be fed into the molten pool established by the electron beam though a guide nozzle associated with an apparatus of the present teachings. The distance between the electron beam and the work piece (e.g., the molten pool in the work piece) may be controlled so that the raw material being deposited is a generally continuous stream of material from the feed wire to the pool deposit (e.g., droplets are substantially avoided). The distance between the electron beam and the work piece (e.g., the molten pool in the work piece) may be controlled so that the raw material being deposited does not accumulate and solidify prematurely in a given location. It is also possible that an apparatus within the present teachings may be outfitted with a servo driven wire feeder that includes a wire straightener and can accommodate wire feed rates up to about 300 inches per minute (IPM) with wire diameters ranging from about 0.030" to about 0.156".

A suitable vacuum pumping arrangement utilizing a combination of mechanical and oil diffusion pumps may be used. The chamber may be such that it provides for suitable vacuum sealing and radiation shielding, and is sufficiently large to house the components necessary for work piece manufacture. For instance, a stainless steel chamber may be employed. The internal chamber dimensions may be at least about 48"×48"×60" (e.g., at least about 68"×68"×92") (L×W×H).

An electron beam gun such as the Sciaky low voltage 60/60 style electron beam gun may be employed. The gun may include fully NC programmable beam focus and deflection features, so that it may be used to perform all welding and deposition activities, as well as generate a beam to scan for monitoring one or more conditions. The gun may be such that it allows for programming and manipulating the electron beam through the use of electromagnetic coils. The operation of the gun may be configured so that there is synchronicity between the programmed beam raster path and the resulting detection signals. By way of example, a suitable EB gun may provide energy in the form of a stream of focused electrons accelerated towards the work piece by a high voltage potential (e.g., greater than about 15 kilovolts, and even as high as about 30, about 60 kilovolts, about 100 kV, or even about 150 kV or higher). The electrons may be generated within the EB gun via one or more heated filament. The power output of the gun may be typically controlled by limiting or throttling the flow of electrons to the work piece. For example, beam current (BC) may be on the order of greater than about 100, 200, 300, 400 milliamps or more.

The entire system may be programmed and controlled via Sciaky's W20XX series CNC and process controller. It is also possible that the teachings herein may employ a separate dedicated computer In addition to the NG1 system controller. Such computer may be configured, for example, to provide a communication link to the NG1 primary controller via Ethernet and may allow for bidirectional data transfer. An example of a suitable closed loop control computer is a quad-core Intel® Pentium system running standard operating system such as Microsoft® Windows XP.

With further reference to the detectors herein, in general, the detector is present for detecting one or more electron phenomena that occurs from emission from the electron beam generator and interaction with a melt pool deposit. The detector may be shielded so that it detects only certain electrons having a pre-selected characteristic (e.g., an energy level range). For example, the one or more detectors may function to detect the presence or absence of beam scatter, absorption or both. Such detection can be correlated with a characteristic of a monitored weld that provides information for controlling adjustments to processing parameters. The detector thus monitors a preselected condition of the deposited material, for example, bulk average temperature of the molten pool deposit, temperature gradient within the molten pool deposit, surface topography of the molten pool deposit, the presence of any liquid-solid interface in the molten pool deposit, surface profile (e.g., shape) of the molten pool deposit, chemical analysis of the molten pool deposit, raw material entry location, raw material height, raw material orientation, or any combination thereof. One particularly preferred approach includes monitoring pool deposit size (e.g., width), and using information about the size (e.g., width) for adjusting one or more parameters. The detector may obtain an image or other data from a location substantially overhead of the molten pool deposit (e.g., via one or more antenna plate). For example, a detector may be positioned substantially overhead of the molten pool deposit, so that a material feed wire may be imaged or otherwise scanned substantially as the wire is melted. The detector may communicate (directly or indirectly via another microprocessor that signally communicates with the control system) information obtained about the preselected condition to the closed loop electronic control device.

Data acquisition may be aided by detection using a suitable detection device. As mentioned, one possible device may employ an antenna plate, such as a plate (e.g., having an annular or donut-like shape) that is disposed between the electron beam and has an opening through which the beam from the gun can pass, but which is of sufficient width that is receives detectable matter, such as scattered electrons) positioned proximate the workpiece, the electron beam gun, or both, that detects a phenomena occasioned by the electron beam. The detection device may detect electromagnetic radiation emitted from interaction of the electron beam with a material in the workpiece (it being recognized that the workpiece will include any present molten deposit) to be imaged or otherwise scanned. The detecting device may detect electrons from the electron beam that are scattered (e.g., backscattered) by the workpiece. For example, a backscatter detector selected from a scintillator, a diode detector (e.g., a silicon diode), a channel plate, or any combination thereof, may be employed.

By way of illustration, without limitation, a suitable plate detector (e.g., an antenna plate, a channel plate detector or both) may be employed that may include one or more regions (e.g., an array of regions or even quadrants) that each include one or more devices that produce secondary electrons in sufficient quantity, along with any scattered electrons to produce a measurable electrical signal. The plate detector may include a metal plate (e.g., a copper plate that has an annular or donut-like shape) that is disposed between the electron beam and has an opening through which the beam from the gun can pass, but which is of sufficient width that it receives detectable matter, such as scattered electrons. The plate detector may be positioned proximate the workpiece, the electron beam gun, or both, so that it detects a phenomena occasioned by the electron beam when the beam is in its imaging mode. The plate detector (antenna) may be generally in-line with a source of an electron beam, as shown in FIG. 2. As seen, the plate detector may include an antenna plate or other detector that is impacted by scattered electrons (or otherwise collects a charge from scattering of electrons), and is in signaling communication with suitable electronics (e.g., via a printed circuit board, an integrated circuit, or a combination thereof) for amplifying the signal from the antenna plate, for changing a signal characteristic of the electron beam or both.

One possible detector in accordance with the present teachings includes at least one antenna plate to which scattered electrons are directed, and from which the extent of scattered electrons can be measured. For example, an antenna plate (e.g., an annular copper plate) may be employed, with suitable amplifying and/or filtering circuitry. Desirably the antenna plate (or other detector) and any associated circuitry are sufficiently robust that an oversaturation of signal is substantially avoided, and when signals are mapped (e.g., to an eight (8) bit gray scale value of which a value of zero (0) is black and a value of 255 is white, over a field of view of a scanned field of approximately 2.50 inches square, at an acquisition rate equivalent to about 15 frames per second), subtle details about the monitored condition are still detectable. For example, the faint lines of a titanium alloy seam between individual deposited beads are visible, as are the feed wire and any wire nozzle.

As indicated, another possible approach is to use in addition to, or as a substitute for an antenna plate, one or more solid state detectors. Such detection device (and/or an antenna plate) may be configured and operated so that it selectively allows passage of only certain electrons or otherwise filters electrons having a predetermined characteristic (e.g., energy level) prior to detection by a detector, thereby preventing oversaturation of the device by scattered electrons. For example, it may employ a detector that is at least partially surrounded by a cage or other structure which may be electrically biased to selectively allow passage through the structure (to the detector) of electrons of a predetermined energy level.

One or more solid state detectors may be located substantially overhead of the monitored workpiece for detecting scattered electrons. For example, they may be located on, substantially adjacent to, and/or in place of an antenna plate. They may be located toward a free end of the electron beam generation device, such as proximate (e.g., within about 10 mm, 20 mm, 50 mm, 100 mm or further) from the location where an electron beam exits the device. They may be axially offset relative to the axis of the emitted beam (e.g., by an angle that is less than about 60°, 45°, 30°, 20°, or even less than about 10° from the beam emission axis). Any such detector may be permanently or removably mounted to a housing for the electron beam generation device. It is thus possible that the detector shall be used as part of an apparatus in which the detector moves along with the electron beam generation device. Any such detector may be mounted using suitable hardware that allows re-positioning and/or positional adjustment of the detector.

A plurality of solid state detectors may be used, with at least two of the detectors being configured for collecting electrons of different energy levels or ranges of energy levels. For example, one detector may collect electrons within a first energy range, and another detector may collect electrons within a second energy range that is different from the first energy range. See, e.g., U.S. Pat. No. 6,399,945, incorporated by reference.

The solid state detectors may be employed for monitoring a molten pool deposit (e.g., a size such as width). It may be employed for monitoring the distance between the electron beam generation device and the work piece. Information about z-axis location of the work piece may be obtained by use of more than one detector, such as by comparing information about the electrons collected (e.g., comparing signals obtained using suitable electronic devices that are in communication with the collected electrons). With knowledge of the location from where the signal was obtained, knowledge about one or more detected signal characteristic (e.g., intensity), and/or knowledge of the location of the electron beam generation device, it is possible to triangulate the distance between the work piece and the electron beam generation device.

When employed, a suitable detector (e.g., a solid state detector) may be carried in a suitable housing structure. For example, one or more bodies of material (e.g., one or more block sections, which may be inter-fitted or otherwise assembled together) may be configured to include one or more interior wall that defines an internal cavity, into which the detector is placed. The housing structure may include a suitable bracket or other hardware for mounting (e.g., adjustable mounting) to a surface, such as to a housing of the electron beam generation device. The housing may be configured for shielding the detector and/or associated electronic components. The housing may include at least one port that allows electrons to enter into the internal cavity. A suitable biasing structure (e.g., a mesh screen that is biased to create an electrical field having predetermined characteristics) may be located upstream of the detector. The biasing structure may be in electrical communication with a suitable power source. By applying a predetermined amount of power to the biasing structure, it is possible to create an electrical field that will repel electrons of certain energy characteristics, but allow certain others to pass through the port or otherwise be exposed to the detector. Suitable electronics may be carried on and/or in the housing, may be located remotely from the housing but in signaling communication with the detector, or both. The housing structure may include suitable conductive paths for communicating with the biasing structure (e.g., one or more bus bars). The biasing structure may be assembled to the housing structure using a suitable retention structure. For example, one or more retaining ring may be employed upstream of the biasing structure. The housing structure may be configured to have a plurality of exterior walls (e.g., it may be shaped generally as a rectangular prism). Any or all of the detectors that are carried within the housing may be axially aligned relative to the port, so that there is a direct line of sight between the port and the detector. It is also possible that any or all of the detectors that are carried within the housing may be axially offset relative to the port, so that there is not a direct line of sight between the port and the detector.

FIGS. 4A-4E illustrate an example of one suitable housing structure 100. It is generally rectangular prismatic in shape, though other external shapes are possible. It includes one or more conductive paths (e.g., bus bars) 102 that are in electrical communication with a biasing structure 104 (e.g., a wire mesh screen). The conductive paths may be adapted to carry a suitable bias (e.g., on the order of about −1kV to about −5kV). They may be soldered, welded or otherwise attached to the assembly. The biasing structure may be held in place by a suitable retention structure, such as retention ring 106. The biasing structure may be located in a port 108 defined in an outer wall.

One or more cavities 110 may be defined in the structure, into which one or more solid state detectors may be placed and housed. For example, a block 112 (e.g., a machined and/or stainless steel block) may be configured to receive the biasing structure and hold it in the housing structure. The internal cavity may optionally include one or more deflecting surfaces, shielding structures or other internal structure for assisting in electron collection. Suitable insulating material may surround one or more of the components (e.g., a G10 insulation material). For example, an insulator may isolate at least portions of the biasing structure. There may be one or more structures employed to help bleed off static charge. The housing structure may include one or more heat shield that at least partially surrounds it. The overall structure may be made from two or more blocks of material that are assembled together.

Figure 4A:
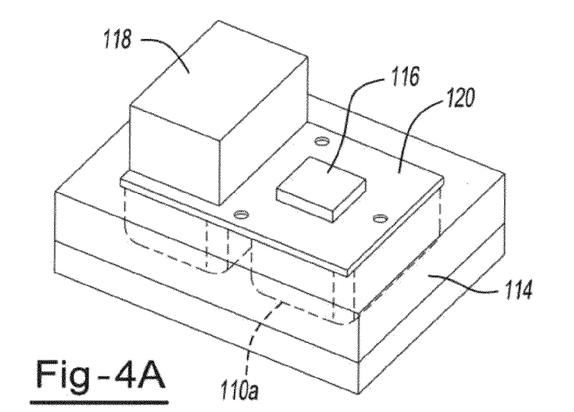
FIG. 4A-4E are various views of an illustrative detector housing structure in accordance with the teachings herein, with FIG. 4c being a sectional view and the others being perspective elevational views (with underlying structure also depicted in phantom).
Figure 4B:
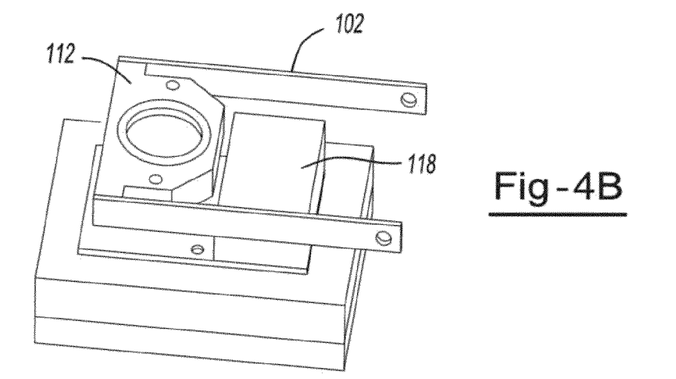
Figure 4C:
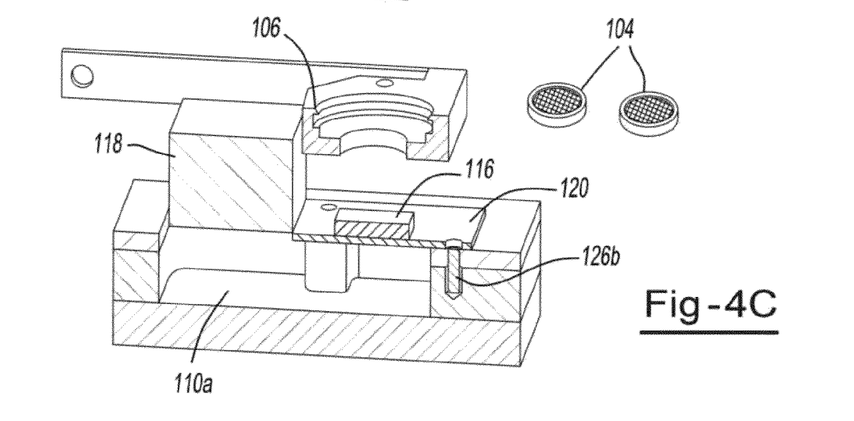
Figure 4D:
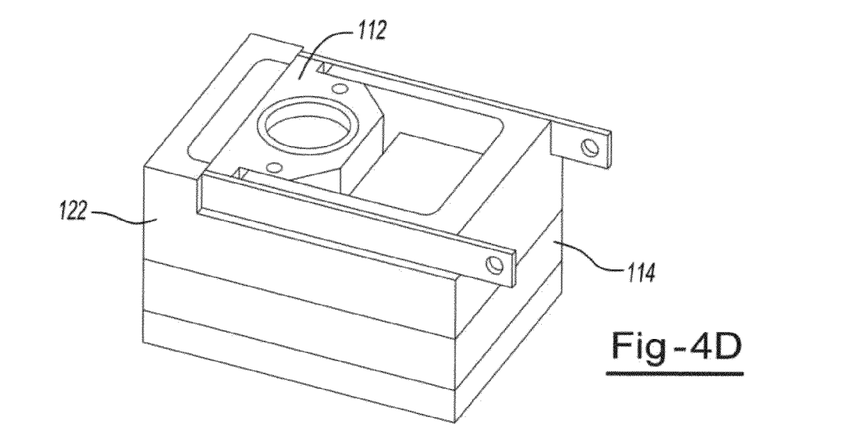
Figure 4E:
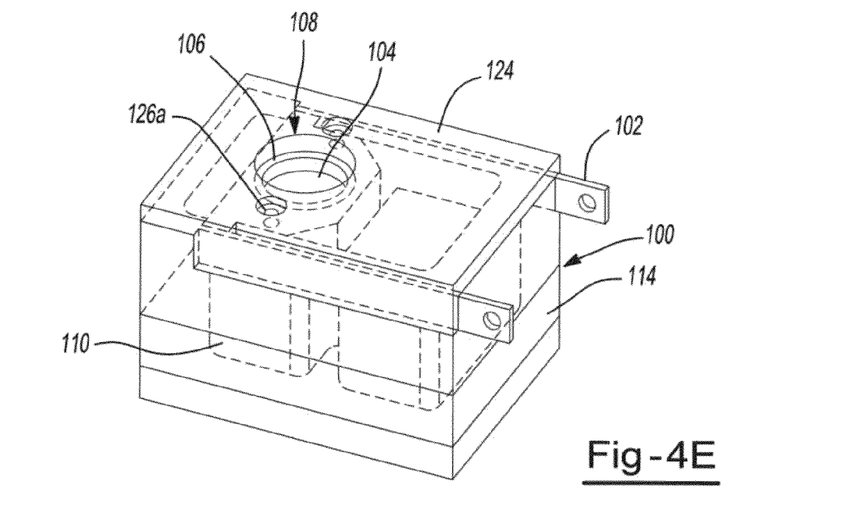

As seen in FIGS. 4A-4C, a base 114 (e.g., a machined metal such as aluminum) may include a cavity 110a. The biasing structure in electrical communication with one or more solid state detectors 116 and associated circuitry 118 (e.g., a suitable amplifier circuit) may be commonly carried on a support 120. Any such support may be configured so that a housing cavity (e.g., cavity 110a) opens in a space adjoining the detector, the circuitry or both. The biasing structure may be positioned generally over the detector (e.g., the screen and detector may be in generally axial alignment with each other).

A housing section with a suitable opening in it may be employed to substantially surround the detector, support, and/or circuitry. For example, a housing section 122 may adjoin the base 114. Additional housing components (e.g., a cover plate 124 having an opening that aligns with and forms part of the port 108) may also be employed to enclose the components. One or more suitable features may allow the components to be assembled together, such as by fastening. For example, there may be suitable threaded apertures 126a and 126b for receiving a threaded fastener. The bus bar or other conductor may extend through (or otherwise be exposed for electrical contacting) a wall of the structure.

It is thus seen how a relatively compact and lightweight device may be achieved that can be attached and carried by the electron beam generation device. For example, the device may be as small as about 1.5"×1.5"×2.3", or it may occupy less than about 10, 8, or even 6 cubic inches in volume.

Other detector configurations are also possible. The detectors may include suitable structure for generating secondary electrons, in response to the scattered electrons detected. For example, plates may have a plurality of elongated tubes. Each side of the plate includes an electrode to create a potential between them. The tubes are coated in their interior with a material that yields secondary electrons due to backscattered electrons striking the inside of the tubes, or the electrode. The secondary and backscattered electrons may thus accelerate down the tube by the potential between the two face electrodes, further hitting the walls. These electrons may thus produce more secondary electrons. Effectively, the electrons are compounded and can be used to produce a measurable electrical signal (e.g., a current useful to generate an electrical signal).

For certain scanned materials the detecting device may even detect cathodoluminescence. The detector may detect secondary electrons generated as products of the electron beam interaction with the workpiece (an example of a secondary electron detector may be an Everhart-Thornley detector or other detector that includes a Faraday cage in front of a scintillator, which may be coupled to a light pipe that leads into a photomultiplier tube). The detector may detect a current of the workpiece. The detector may detect radiation (e.g., x-rays) occasioned by the interaction of the electron beam with the workpiece. The detector may detect electrons that are transmitted through the workpiece.

Detection according to the present teachings may be for purposes of directly obtaining a measurement that is indicative of a condition of a pool deposit. It is possible that a detection technique may be employed that indirectly measures a condition of a pool deposit by observing a detectable characteristic, and then correlating the detected characteristic with an indication of a particular condition. To illustrate, under this approach, oscillation frequency of a pool deposit may be monitored, and may be correlated with depth of a deposition pool, it being theorized that a higher detected frequency may indicate less penetration of a molten pool deposit into a previous deposition layer.

Any detecting device used herein may include a plurality of regions (e.g., quadrants), each of which if delivers an output signal (e.g., substantially contemporaneously) to a suitable readout device. Accordingly, a plurality of input signals may be synchronized with a plurality of output signals for the detector.

The detector may be configured so that it operates at an data (e.g., image) acquisition rate or frame rate that is equivalent to a rate of at least about at least about 10, 15, 20, 25, 30, 40, 50, or even 60 or more images per second. It may operate at even higher rates (e.g., at least about 100, 150, 250, or even 500 images per second).

The detector may be used in any step of monitoring, which may include capturing an electronically stored image substantially in real time (e.g., it is less than 5, 4, 3, 2, 1, or lower, seconds from the time of the event recorded). The detecting device may detect electromagnetic radiation emitted from interaction of the electron beam with a material in the work piece (it being recognized that the work piece will include any present molten deposit) to be scanned or imaged.

One or more additional modes of detection may be employed in combination with the detection of the electron phenomena. A suitable seam tracking laser camera (e.g., a camera by Servo-Robot, Inc.) may also used to perform measurements. The laser camera may work under a principle of triangulation and thus may generate a series of Y-Z points that represent a 2 dimensional profile. By mounting the laser camera to one of the systems motion axes and translating it across a part, a 3 dimensional profile can be created and analyzed offline. It is also possible to employ an optical imaging system as described in U.S. Application No. 61/243,242 now U.S. application Ser. No. 12/883,340 (incorporated by reference). The processes herein thus may also contemplate monitoring distortion of a workpiece in the z-axis. This may be distortion that occurs due to residual stresses left in the deposit after it cools. It may be distortion that occurs by virtue of some other influence on a profile of a deposited layer. It is possible that the monitoring may include comparing a monitored value with a known baseline value.

An image (which optionally may be enhanced by a color map, wherein certain colors correspond to certain defined conditions) may be generated in connection with monitoring for z-axis distortion, for work piece distance relative to electron beam generation device or both. The image may be employed to visually identify evidence of "spatter" that may exist along an edge of the workpiece. For instance, such spatter may occur when the Z height is not controlled, the wire detaches from the molten pool causing a change in the thermal conduction characteristics of the pool and wire resulting in "drips" that can result in drops of material that fall outside of the molten pool.

Monitoring in accordance with the present teachings may include a combination of detecting an electron phenomena and one or more steps of optical image monitoring. Thus, the apparatus herein may include a camera (e.g., a high speed camera) with an image detector that includes one or more of the following features: an array of active pixels (e.g., a CMOS image detector array, a CCD (charge coupled device) image detector array, or both); progressive scan; resolution that is at least about 640×480; preferably at least about 752×582; and more preferably at least about 1024×1024 pixels. Examples of art-disclosed CMOS imaging systems are found in U.S. Pat. Nos. 6,815,685; 7,107,118; 7,380,697, all of which are incorporated by reference herein. Such detector may be configured so that it operates at an image acquisition rate or frame rate that ranges from about on the order of at least about 25 frames per second, e.g., about 30 frame per second (fps) or higher. It may operate at least at about 40 fps, at least at about 50 fps, or even at about 60 fps, or more. For example, it may operate at about 25 to about 500 fps (e.g., about 30 to about 60 images per second, about 150 fps, or faster). Suitable detector arrays for detectors may have a pixel size of about 9×9 $\mu m^2$, to about 12×12 $\mu m^2$ (e.g., about 10.6×10.6 $\mu m^2$). Suitable cameras may include a complementary metal oxide semiconductor (CMOS) active pixel image detector, charge coupled device (CCD) image detector, or both, preferably housed together with suitable optics and associated electronics. Examples of preferred cameras are available from Photon Focus of Switzerland (e.g., under model number MV-D1024E-40-CL-12, MV-D752-28-CL-10, or MV-D1024E-160). The detector may include one or more other features as described in U.S. Application No. 61/243,242 (incorporated by reference) (see, e.g., paragraphs 47-55 and associated drawings).

An optical image detector useful herein may include a cooled camera housing that has a front flange; at least one spacer pad connected to the front flange; at least one seal adjoining the spacer pad (e.g., located in-between a plurality of spacers, the front flange and spacers, or both); a rear flange connected to the front flange and sandwiching therebetween the at least one spacers and seals; wherein the front flange, the at least one seal, the at least one spacer pad, and the rear flange form an interior cavity; a plurality of printed circuit boards located within the interior cavity; an image detector; and wherein at least one of the flanges (e.g., the front flange) includes an inlet, an outlet, a fluid passage between the inlet and the outlet through which the fluid is passed for cooling the printed circuit boards during their operation, and optionally a mount adapter. The detector may include a vapor protection device that includes a block having an aperture through which a gas is flowed. For example, the vapor protection device may include a block that includes a base portion and a cover portion, the base portion including at least one fluid port that receives a gas stream that may be controllably regulated, the base portion and the cover portion each having an aperture that is generally axially aligned with each other and is adapted to be axially aligned substantially overhead of a molten metal pool deposit; at least one reflective substrate that is in optical communication with at least one of the apertures of the cover portion, or the base portion, for reflecting an image that passes through such aperture to a separately housed optical imaging device that records the image; wherein the gas stream enters the at least one fluid port and exits the block through one of the apertures, and provides an optically transparent protective barrier to prevent passage of metal vapor through the other aperture. The cooled camera housing and the vapor protection device may be separate and spaced apart from each other.

Thus, the detector may have a vapor protection device as described in U.S. Application No. 61/243,242 (incorporated by reference) (see, e.g., paragraphs 60-72 and associated drawings), a thermally regulated housing as described in U.S. Application No. 61/243,242 (incorporated by reference) (see, e.g., paragraphs 73-85 and associated drawings), or both.

The cooled housing and vapor protection device may share a common housing. For example, the detector may include a detector array, optionally an electronic shutter, and a lens system with associated optical train mounted within a water cooled enclosure having a pinhole. There may be a ninety degree turning element within the optical train. An image of the molten pool deposit may pass through the pinhole, along with a gas that helps prevent vapor buildup. Thus, another example of a monitoring system that may be employed is depicted in U.S. Pat. No. 6,091,444 (incorporated by reference).

Any one or combination of the detectors herein may be used to generate an image from the detected signals. They may also be operated to provide information to a control device so that an image is unnecessary and is avoided. For example, the detectors may be operated to obtain information from a certain predetermined location or region, and to compare such information against stored values (e.g., predicted values) for such location or region. Such comparing may be done, for example, by programming a predetermined value into a processor. Such comparing may involve ascertaining if a measured value meets a certain threshold value that is sufficient to trigger a control operation to be perform. An alteration in processing condition may occur if a predetermined sufficient deviation between detected and stored values is observed, or otherwise by evaluating how a measured value performs relative to a predetermined threshold value.

By way of illustration, measurements may be taken at one or more locations, such as a leading edge region of a deposit (e.g., the edge region of the deposit that is located where molten metal is introduced into the molten pool, a trailing edge region (e.g., the region of a deposit that is in a state of cooling, and at which some solidification may even have commenced) of a deposit, or even along an intermediate location. This may be done, for example, when it is desired to measure pool deposit width.

Figure 3:
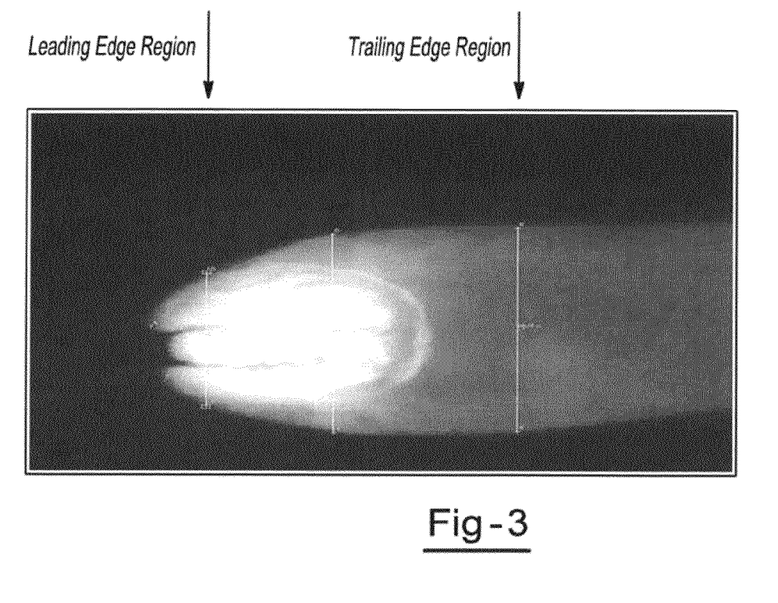
FIG. 3 is an illustration to depict edge locations in a pool.

FIG. 3 shows an example of one possible image frame with several measurements being taken at various locations. By way of illustration, three (3) width measurements locations may be identified at locations referred to as the pool leading edge (shown as the furthest left side line spanning the width, corresponding approximately with the entry point of the wire at its midpoint), the pool mid-line, and the pool trailing edge region (shown in FIG. 3 as the furthest right side line spanning the width). The trailing edge region will be located upstream of the wire center. Thus, it is possible that width measurements are taken at one or more locations that is about 0.5 cm, 1 cm, 2 cm, 3 cm, 4 cm, 5 cm or further upstream of the wire center. A number of additional points are identified near the wire at the leading edge of the pool. Additional points about the wire (shown to the left of the leading edge) may be used to evaluate Z height information this image as well.

As mentioned, it is possible that an image may not be generated. Instead a limited detection is done over a specific region (e.g., along one or multiple locations generally along the leading, intermediate and/or trailing edge region of the pool). Data may be compared with stored predicted data or some other threshold, and an alteration to a processing condition performed as a result of the comparison.

The closed loop electronic control system may then signally control (directly or indirectly) operation of one or more components of the apparatus in response to a detected condition. The control device may suitable for and operated for altering one or more conditions.

For example, one or more of the conditions altered may be the location of any energy emission device for supplying energy to melt the raw material; the location of any material delivery device used for feeding the raw material; the location of the work piece support upon which a work piece is built relative to the electron beam generator (e.g., electron beam generator travel velocity); the pressure of any environment in which the processing is performed; the temperature of any environment in which the processing is performed; the voltage (e.g., accelerating voltage) or other energy (e.g., energy controlled by controlling beam current, accelerating voltage or both) supplied to melt the raw material; the beam used for any electron beam source of energy for melting the raw material (e.g., the beam focus, the beam power, beam raster pattern, path or other characteristic that may be controlled by controlling a deflection and/or processing coil parameter); the feed rate of the raw material or other feed control parameter (e.g., the timing when feed starts and/or stops); the composition of the deposited material; the temperature of the work piece; the temperature of the platform; or any combination thereof. Controlling of the beam may include deflecting and/or scaling of a beam, such as in the x and y directions. It is possible that during controlling operations that one or more conditions are maintained substantially constant. For example, electron beam generator travel velocity, feed rate or both may be maintained substantially constant. The detector and control device make it possible to perform an LM process automatically, and especially without the need for operator intervention (e.g., without the need for complete reliance upon subjective human operator observations about operating conditions, without the need for complete reliance upon manual adjustment of one or more operating parameters by a human operator, or both).

Additional aspects of a suitable system may be ascertained from one or both of U.S. Application No. 61/243,242 (incorporated by reference), and U.S. Pat. No. 7,168,935 (incorporated by reference).

The raw materials used by the LM process may include one or any combination or alloy of metals (e.g., metals including a transition metal or an alloy thereof). Examples of raw materials that may be used are: titanium, aluminum, iron, nickel, chromium, (e.g., inconel), cobalt, stainless steel, niobium, tantalum, copper, bronze, brass, beryllium, copper, vanadium, or tungsten. Particular examples of materials useful in the present technology are titanium and alloys of titanium (e.g., also including aluminum, vanadium, or both), such as one including titanium in a major amount (or substantially the balance) and about 3-10 wt % Aluminum (Al) (more preferably about 6 wt %), and 0 to about 6 wt % Vanadium (V) (more preferably about 4 wt %)). The raw material may be supplied and/or fed in various shapes and sizes. In one preferred embodiment, the raw material is provided in the form of a wire feed stock. The raw materials may be provided in an already heat-treated (e.g., tempered) condition. It is also possible that the raw material may be provided in a powder material form, in which case, the material delivery device will be configured to include a suitable metering device for delivering a predetermined quantity of powder.

The material delivery device may be adjustable so that it is capable of feeding relatively large or even relatively small diameter wires (e.g., wires supplied by a wire spool, may have a diameter below about 5 mm, below about 3 mm, or even below about 1 mm) at both high and low speeds. The material delivery device may include one or more guide structures (e.g. one or more guide tubes 24) that help control wire position. It is also possible that a plurality of wires (of the same or different material type) may be fed from one or more material delivery devices, at one or more angles and/or distances from the molten pool deposit. During deposition, the system herein may be operated and controlled so that there is a continuous and generally uninterrupted matter streaming from the solid wire to the liquid molten pool deposit. For example the system may be operated and controlled so that there is no disconnection of the wire and the pool deposit and no droplet formation that arises in the feed path of the wire into the deposit.

Power required to operate the electron beam generation device may be supplied from one or more suitable power sources, for example, power via at least one electrical feedthrough power supply. For example, the power source may deliver power greater than about 10 kilowatts (kW), or even greater than about 30 kW. It may deliver power up to about 100 kW (e.g., up to about 50 kW). The energy emission device may be signally connected to one or more processor (e.g., a processor of a controller, a computer or otherwise) for controlling the energy output from the power supply. The processor may be included in the closed loop electronic control device or may be part of a separate computer and/or controller, which is operated by the closed loop electronic control device.

A preferred energy emission device may include an electron beam generator that may focus a supply of electrons against the raw material (e.g., an electron beam gun). Upon contact with the raw material, the electrons may heat the raw material to cause the raw material to soften, vaporize, and/or melt, and thereby introduce the raw material into a molten deposit. For example, the energy emission device may generate an electron beam (which may be focused to a desired beam width or span). The electron beam may be achieved with a low accelerating voltage, preferably between about 3 kV to about 80 kV, more preferably about 10 to 60 kV, and even more preferably between 35 and 55 kV; with a maximum beam power in the range of up to about 10 to about 15 kW (e.g., about 3 to about 5 kW); by using about 100 V to about 600 V (e.g., 110 V) input power; or any combination thereof. Preferably, the energy emission device may be operated so there is sufficient power density for the electron beam freeform fabrication process, while still providing suitable radiation shielding. The processes may operate the energy emission device within some or all of the above parameters.

One approach to the operation of an electron beam gun may be to maintain the parameters of the gun at a sufficient level so that the maximum depth of a molten pool deposit may be less than about 3 cm, more preferably less than about 1 cm, and possibly even less than about 0.5 cm. It is possible that the beam may be operated in a generally defocused mode. For the deposition of a material, scanning for detection, or both, the beam may be rastered in a suitable pattern, such as generally non-circular pattern (e.g., generally in an elliptical pattern, a linear pattern, a polygonal pattern, a spiral pattern or any combination thereof). For example, a beam having a width of about 0.5 to about 0.8 mm may be rastered to cover an effective width of about 1.0, 2.0, 3.0 mm, or larger. In this manner, a relatively large amount of energy may be dispersed over a relatively large area, but to a relatively shallow depth, as compared with traditional electron beam welding.

The processes also contemplate operating the energy emission device variably or constantly within some or all of the above parameters. For instance, in response to a detected condition, one or more of the above parameters may be varied by a signal sent from a closed loop control device as taught herein. By way of example, the operation of the energy emission device may be controlled in a suitable manner to achieve a preselected size for a deposited melt pool. The size or other condition of the deposited melt pool may be measured by the detector 18 (e.g., metal melt pool deposits are controlled to maintain successively deposited layers so that they exhibit a melt pool diameter or width of about 0.3 mm to about 20 mm, or even about 0.5 mm to about 13 mm).

To the extent not taught expressly here, or elsewhere herein, other art-disclosed operational parameters may be employed, such as are disclosed in U.S. Pat. No. 7,168,935, incorporated by reference (see, e.g., cols. 5, 9, and the claims). Other art disclosed energy emission devices may be employed alone or in combination with an electron beam gun, such as a laser.

The LM apparatus herein further may include a closed loop electronic control device for controlling operation of one or more components of the LM apparatus in response to a condition detected by the detector. In one embodiment, one or more of the controls (e.g., closed loop control device) and data acquisition may be electronically managed through a user interface and display device (e.g., suitable instrumentation, such as one or more computers). The closed loop electronic control device may operate to perform one or any combination of functions. Most generally, the closed loop electronic control device may acquire one or more signals obtained by the detector (e.g., in real time, as the detector or any detecting device is monitoring the work piece). The closed loop electronic control device may process the signal by comparing it with a stored value (e.g., a value that is programmed into a database, a value from a previous reading, or both). Based upon the step of comparing, the closed loop electronic control device may issue a command that may cause the processing parameters to be changed to one or more different processing parameters (e.g., the closed loop electronic control includes a processor that is programmed to perform the comparison and then issue a certain signal based upon the results of the comparison). For example, the closed loop electronic control device may issue signals to one or more of the following: material delivery device, the energy emission device, the work piece support, the detector, an electrical supply, a vacuum device, a gas supply, or the vapor protector. The command from the closed loop electronic control device may cause the alteration of one or more conditions, as have been described previously.

Examples of suitable software that may be used for the programming of devices used in the present invention include software available from National Instruments (Austin, Tex.) under the designation NI Developer Suite (Including LabVIEW PDS, LabWindows/CVI, Measurement Studio, SignalExpress, LabVIEW and LabWindows; and optionally Image Acquisition and Machine Vision Option for NI DevSuite (includes Vision Development Module, Vision Builder for Automated Inspection, and Vision Builder for AI Development Kit).

The control may include machine control and process control functions. An example of a suitable commercially available control system is available from Sciaky Inc., under the designation W20X0. The control system may include a suitable computer control and interface (which may include one or more micro-computers, servo drive modules, input/output modules, or signal conditioning module). The control system may include one or more suitable processors (e.g., a processor with at least one VME or other standard bus back plane), such as the 680X0 series of processors (e.g., 68040) from Motorola, with the processors including on-board memory (e.g., RAM memory). More preferably, an Intel® Pentium® processor may be used. The control system may include a user interface component (e.g., suitable input/output hardware that communicates with the processor and allows programming of the processor, such as by a Microsoft Windows™ operating systems, or otherwise). The control system may include suitable software (e.g., software available under the designation Sciaky Weld 20XX (e.g. W2000, W2010, W2020) or some other W20 family of software).

The W20XX control system may be in signaling communication with one or more suitable computer (e.g., T7400 Workstation PC, by Dell) that may be used to perform closed loop parameter adjustments sent to operate the overall system (e.g., a power supply (which may include a solid state power supply), an electron beam gun, any detector or detecting device, any data acquisition electronics, or otherwise)). The control system may be in signaling communication with hardware, such as an energy emission device, a monitor, a work piece support, or other hardware that is controllable according to the present teachings.

Thus, the computer application software, computer system, and the closed loop electronic control device, or a combination thereof may be in communication with the detector so that process parameters may be monitored as previously discussed herein and controlled. Controlling may be based upon a detected shape of a melt pool deposit. For example, a detected shape may cause the control system to change a processing condition such as one that affects melt pool surface tension, a feed condition, or both.

Other aspects of the control are found in U.S. Patent Application 61/243,242, now U.S. application Ser. No. 12/883,340, incorporated by reference.

The time lapse between when a melt pool deposit is formed and when a condition is altered in response to a detected condition is rapid, e.g. it may be less than one minute, less than 30 seconds, less than 10 seconds, less than 5 seconds, or even less than 1 second. Thus, substantially real time condition adjustment is possible.

A computer, having a user interface, may be employed for commanding and controlling the fabrication process. A human operator may evaluate the overall operation of the energy emission device, the material delivery device, positioning mechanisms, vacuum operating parameters, or any combination thereof. Though the objective of the present invention is to form an automatic system, some aspects of the present invention may be used in a process that requires human intervention. The closed loop electronic control device may be configured to make the appropriate command inputs through the monitoring system and control software, or both, to manage the various systems of the layer manufacturing process.

The present teachings also contemplate articles of manufacture made using the LM method, the LM apparatus, or both. The method of making the articles may result in a near net shape part that may be ready for finish machining. The article of manufacture may be an original equipment component, a replacement part, or a repaired original equipment component. The article may be heat-treated subsequent to its layer by layer manufacture. The article may be an aircraft component, a rocket component, a marine craft component, a railcar component, an automotive vehicle component, a chemical processing component, a turbine component, or a space vehicle component. A substantially homogeneous microstructure may be obtained throughout at least about 50% (and more preferably at least about 80%) of a section thickness of the article. For example, a substantially homogeneous microstructure having a plurality of columnar grains may be obtained throughout at least about 50% (and more preferably at least about 80%) of a section thickness of the article. The article of manufacture may have an overall weight of at least about 10 kg, and may be made in a period of less than about 20 hours. For example, an article weighing about 60 to about 150 kg (or more) may be made in a period of no longer than about 20 hours.

In one embodiment, the article may exhibit a resulting substantially homogeneous microstructure, which is obtained throughout at least about 50% (and more preferably at least about 80%) of a section thickness of the article. For example, the article may be a substantially homogeneous microstructure having a plurality of columnar grains that is obtained throughout at least about 50% (and more preferably at least about 80%) of a section thickness of the article.

Relatively large articles (e.g., greater than 750 cm³) may be metallic and may be made (e.g., the processes being completed) in a period of less than about 150 hours (e.g., less than about 100 hours, preferably less than about 50 hours, or even more preferably less than about 20 hours) for each article. The article may be prepared directly from computer-aided design data. The article may be prepared using a process, apparatus, or both that may be: free of a laser, prepared from a continuous deposition of each individual layer, prepared from an intermittent deposition of each individual layer, prepared in the absence of processing condition adjustment by a human during layer by layer buildup, or any combination thereof. It may be free of an ultrasonic detection method.

Any depositing step may be performed so that the molten pool deposit undergoes a substantially continuous change in thermal condition in three-dimensions throughout the process. The steps may be performed at a rate sufficient to deposit successive layers at least about 2.5 kg of the raw material per hour, preferably at least 3 kg per hour (e.g., about 3.3 to about 6.8 kg per hour). The steps may be performed at a rate sufficient to deposit the raw material as a plurality of beads that define successive layers having an average bead width of about 10 to about 15 mm (e.g., about 12.7 mm) at a rate of at least about 25 cm of bead per minute (e.g., about 35 to 80 cm per minute or higher). The process may be interrupted for a period (e.g., of at least one minute, one hour, two hours, one day, or longer) prior to completion of the work piece, and may be resumed after complete solidification of the work piece has occurred.

Structural relations, proportions, dimensions and geometries shown in the accompanying drawings are part of the teachings herein, even if not articulated verbally in the present detailed description. The teachings herein also contemplate variations to any relative proportions and dimensions shown in the drawings; e.g., variations within about ±10%, about ±25%, or even about ±50% are possible.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. The specification of ranges herein also contemplates individual amounts falling within the range. Thus, for example, a range of 10 to 15 contemplates individually the amounts of 10, 11, 12, 13, 14, and 15.

The disclosures of all articles and references, including patent applications and publications, are incorporated by reference for all purposes. References to the term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of, the elements, ingredients, components or steps.

Plural elements, ingredients, components, or steps can be provided by a single integrated element, ingredient, component, or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. Likewise, any reference to "first" or "second" items is not intended to foreclose additional items (e.g., third, fourth, or more items); such additional items are also contemplated, unless otherwise stated. Any references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

The teachings of the relative positions, orientations and proportions of components depicted in the accompanying drawings also form part of the teachings herein even if not expressly stated.

It is understood that the above description is intended to be illustrative and not restrictive. Many embodiments as well as many applications besides the examples provided will be apparent to those of skill in the art upon reading the above description. It is further intended that any combination of the features of different aspects or embodiments of the invention may be combined. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

The invention claimed is:

1. A process for layer manufacturing a three-dimensional work piece comprising the steps of:
    (a) feeding raw material in a solid state to a first predetermined location;
    (b) exposing the raw material to an electron beam to liquefy the raw material;
    (c) depositing the raw material onto a substrate as a molten pool deposit, the deposit having a forward edge region and a trailing edge region, under at least one first processing condition;
    (d) monitoring the molten pool deposit for at least one preselected condition using detecting of scatter from a scanning electron beam contemporaneously with the depositing step, optionally using a detector that is in a housing configured so that the detector detects electrons of a preselected characteristic;
    (e) consecutively switching the scanning electron beam back and forth between the electron beam for melting and the scanning electron beam at a rate of at least 5 times per second;
    (f) solidifying the molten pool deposit;
    (g) automatically altering the first processing condition to a different processing condition based upon information obtained from the monitoring step (d); and
    (h) repeating steps (a) through (g) at one or more second locations for building up layer by layer, generally along a z-axis that is orthogonal to an x-y plane, a three-dimensional work piece;
    wherein the electron beam is employed for both exposing and monitoring so that the scanning electron beam is a beam emitted from an electron beam generating device that also emits the electron beam to liquefy the raw material.

2. The process of claim 1, wherein the monitoring step includes detecting electrons scattered in a region proximate the molten pool deposit during build-up of the work piece.

3. The process of claim 1, wherein the monitoring step includes detecting electrons scattered in the region proximate the molten pool deposit during build-up of the work piece, by use of at least one detector that detects data from at least about 4000 beam deflection location points on a target.

4. The process of claim 1, wherein the monitoring step includes detecting electrons scattered in a region proximate the molten pool deposit during build-up of the work piece, by use of at least one detecting device encased in a cavity of a housing and accessible via a port of the housing.

5. The process of claim 1, wherein the monitoring step includes detecting electrons scattered in a region proximate the molten pool deposit during build-up of the work piece, by use of at least one device that includes a shielded detector housing and that selectively excludes from the housing electrons having a predetermined energy level to prevent their detection by a detector carried in the housing.

6. The process of claim 1, wherein the scanning electron beam is maintained at a power level greater than about 500 watts during the monitoring step.

7. The process of claim 1, wherein the scanning electron beam is maintained at a substantially constant width for a period during consecutive steps of exposing and monitoring.

8. The process of claim 7, wherein during consecutive steps of exposing and monitoring, the beam is rastered according to a predetermined pattern.

9. The process of claim 8, wherein one or more deflection coils raster the beam.

10. The process of claim 1, wherein the at least one preselected condition includes a trailing edge region width of the molten pool deposit or otherwise upstream of the feed of raw material.

11. The process of claim 1, wherein the at least one preselected condition includes a width of the molten pool deposit, and wherein (i) upon detection of a width that exceeds a certain predetermined value, the power of the beam is reduced, (ii) upon detection of a width that is below a certain predetermined value the power of the beam is increased, or both (i) and (ii).

12. The process of claim 1, wherein the monitoring step also includes a step of monitoring the distance of an electron beam generating device to the work piece during build-up of the work piece, and altering a processing condition based upon detection of a distortion in the z-axis.

13. The process of claim 12, wherein the step of monitoring a distance of an electron beam generating device to the work piece includes a step of detecting by monitoring a laser beam, by optical image monitoring, electron beam scanning detection, or both.

14. The process of claim 13, wherein the step of monitoring the distance of an electron beam generating device to the work piece includes a step of triangulating the distance.

15. The process of claim 11, wherein the step of monitoring a distance of an electron beam generating device to the work piece includes detection by optical image monitoring with a digital camera that includes a vapor protection device, a thermally regulated housing, or both.

16. The process of claim 1, wherein the step of monitoring is free of any step of generating an image from scattered electrons.

17. The process of claim 1, wherein the step of automatically altering is performed by at least one control device that is in electrical signaling communication with the electron beam gun, and wherein during the monitoring a detection signal that is transmitted to the at least one control device upon detection of scatter and which is indicative of a characteristic of the scatter, the detection signal information from the signal is compared with a predetermined value, and based upon such comparison the control device issues a control signal to the electron beam generating device.

18. The process of claim 1, wherein a laser beam monitors a distance of the electron beam generating device to the work piece during build-up of the work piece.

19. The process of claim 18, wherein a process condition is altered based upon a detection of distortion in the z-axis.

20. The process of claim 1, wherein an image is generated in connection with monitoring for z-axis distortion, for a distance of the work piece relative to the electron beam generation device, or both.

* * * * *